United States Patent [19]

Jacoby

[11] 4,261,440
[45] Apr. 14, 1981

[54] AUTOMATICALLY COMPENSATING OBJECT DETECTION CIRCUIT

[75] Inventor: Herbert Jacoby, Farmington, Conn.

[73] Assignee: Otis Elevator Company, Hartford, Conn.

[21] Appl. No.: 52,172

[22] Filed: Jun. 26, 1979

[51] Int. Cl.³ ............................................. B61B 1/00
[52] U.S. Cl. ......................................... 187/48; 49/28
[58] Field of Search .......... 187/48, 52, 29 R, DIG. 1; 49/25, 28; 328/5; 318/662

[56] References Cited

U.S. PATENT DOCUMENTS

| | | | |
|---|---|---|---|
| 2,720,284 | 10/1955 | Galanty | 187/48 |
| 3,018,851 | 1/1962 | Diamond et al. | 187/48 |

Primary Examiner—Robert J. Spar
Assistant Examiner—Kenneth Noland
Attorney, Agent, or Firm—Robert E. Greenstien

[57] ABSTRACT

Antennae located in the doors of an elevator car are in circuit with a balanced bridge detector coupled to an oscillator. Increased capacitance to ground produced by a person or object between the doors creates a bridge disbalance, which gives rise to the production of a bridge output signal whose level is proportional to the change in capacitance. Each time the car door opens at a floor, the signal level from the bridge obtained at an intermediate door position is stored as a reference indicative of the capacitance change resulting from dynamic environmental and structural factors. When the doors are fully open, the output from the bridge is compared with the stored signal level for detecting the additional capacitance created by a person or object between the doors and controlling door movement accordingly.

7 Claims, 2 Drawing Figures

AUTOMATICALLY COMPENSATING OBJECT DETECTION CIRCUIT

BACKGROUND OF THE INVENTION

This invention relates to apparatus for detecting the presence of objects within a boundary area, for example, passengers or objects between the doors of an elevator car.

In typical elevator installations where the cars are operated automatically, it is common practice to provide apparatus to protect passengers against injury from the automatically closing doors. Such apparatus frequently include arrangements employing antennae located along the door edges in order to detect the presence of a person or object. Detection is accomplished by sensing the change in capacity brought about between the antenna and ground caused by the proximity of the person or object to the antenna. Such apparatus may be utilized to halt the door movement or cause continuous door retraction until the path is clear. Apparatus of this type are disclosed in the following patents which are commonly owned herewith: U.S. Pat. No. 2,601,250 to Bruns et al for a SAFETY SYSTEM FOR DOORS, which issued on June 24, 1952; U.S. Pat. No. 2,720,284 to Gallanty for ELEVATOR DOOR CONTROL MECHANISM, which issued on Oct. 11, 1955 and U.S. Pat. No. 3,018,851 to Diamond et al for CONTROL MECHANISM FOR DOORS, which issued Jan. 30, 1962, and U.S. Pat. No. 3,743,058, also to Diamond, which issued on July 3, 1972.

As disclosed in the patent to Bruns, each antenna is coupled to an electronic gas tube which fires as a result of increased capacitance between the antenna and ground. When the tube fires, the door may be stopped or reversed by suitable door motion controls until the path is clear.

In the patent to Gallanty, antennae are arranged in a pattern along the door edges to minimize erroneous door movement by compensating for some of the field disturbances arising from external elements, such as the hoistway doors and door jams.

In the first identified patent to Diamond, an arrangement is disclosed for improving the operation of the Gallanty system, by improving its immunity to disturbances from external elements. Each antennae forms one arm of a balanced bridge detector that includes variable capacitors which are adjusted so that the bridge is balanced when there is no object in the detection area of the antennae. An object entering the detection area produces increased capacitance, which causes a bridge unbalance and the consequent generation of a bridge output signal whose level is proportional to the change in capacitance. The output signal, which thus indicates the presence of an object between the doors, may be coupled to the door motion control apparatus to control door movement accordingly. The antennae may be arranged in a selected pattern around the door to minimize blind spots.

Environmental or ambient factors, such as humidity and temperature, frequently produce day to day and floor to floor changes in capacitance in elevator systems. As a result of this, balanced bridge systems may generate erroneous door motion control signals, causing the doors to move randomly or hang up on certain floors. Since car motion is typically geared to door position, the car will be immobilized, causing service interruption. Such effects may be prevented, in some instances, by bridge recalibration to null out any unbalance due to such factors. But where these factors change frequently, recalibration is not feasible. One example of this are the summer months, which typically are characterized by wide variations in humidity and temperature. Moreover, in air-conditioned buildings the temperature and humidity may vary dramatically at different times of the day as a result of controlled air-conditioning use. Where the humidity varies considerably, the capacitance sensed by the antennae similarly varies, and, thus, under those circumstances it is virtually impossible to achieve reliable bridge balancing. Consequently, when such conditions are encountered, the elevator system is especially susceptible to erroneous door movement and the deteriorated system speed, which results when the cars are unpredictably immobilized at certain floors.

The later patent to Diamond describes a self-adjusting proximity detecting apparatus which focuses on improving the operation of the system shown in the first Diamond patent principally by nulling out the balance bridge output signal caused by humidity and external elements—other than people and objects in the vicinity of the antennae. While this system offers significant improvement, it may be adversely effected by environmental and structural effects which may saturate the detector output, causing the detector to be blinded to the presence of an object, and thus rendering the detector ineffective. The bridge detector gain may be lowered to remedy this, but lowering the gain reduces detector sensitivity. With reduced sensitivity only objects which are very close to the doors are detectable; consequently, the doors may have to close on an object before it can be detected; the doors are then retracted, since this increases amount of door motion at each stop and it decreases overall system speed. Conversely, high sensitivity increases system speed because there is less unnecessary door motion.

SUMMARY OF THE INVENTION

Objects of the present invention include providing capacitance sensing door motion control apparatus, which automatically compensate and adjust for capacitance variations in the system.

According to the present invention, in order to eliminate the effects produced by environmental and structural factors, the result of those effects on the bridge output is compared with the bridge output as the doors start to close. If the difference between the two is of a certain level, it indicates the presence of an object in the door path.

A significant feature of the present invention is that in those bridge detector systems, where gain reduction is made to prevent bridge detector output saturation, the invention increases the sensitivity because object detection is accomplished by referencing two detector signals, rather than by sensing the absolute value of a single signal. Thus, small capacitance changes may be detected, even at low gain.

A feature of the present invention is that the effects from the environmental and structural factors may be sensed on a floor by floor basis at each car stop. In this way dynamic variations are automatically taken into account. Consequently, a system utilizing the present invention never required recalibration or adjustment.

Another feature of the invention is that it may be embodied in a circuit which is readily connectable to existing systems utilizing a balanced bridge detector.

Another feature of the present invention is that it may be embodied in other apparatus for use in systems in which similar detection problems resulting from structural and environmental factors are encountered, especially where those factors vary dynamically.

Other objects, benefits and features of the invention may be apparent to one skilled in the art in the following detailed description, claims and drawing, wherein:

DETAILED DESCRIPTION

Figure 1:
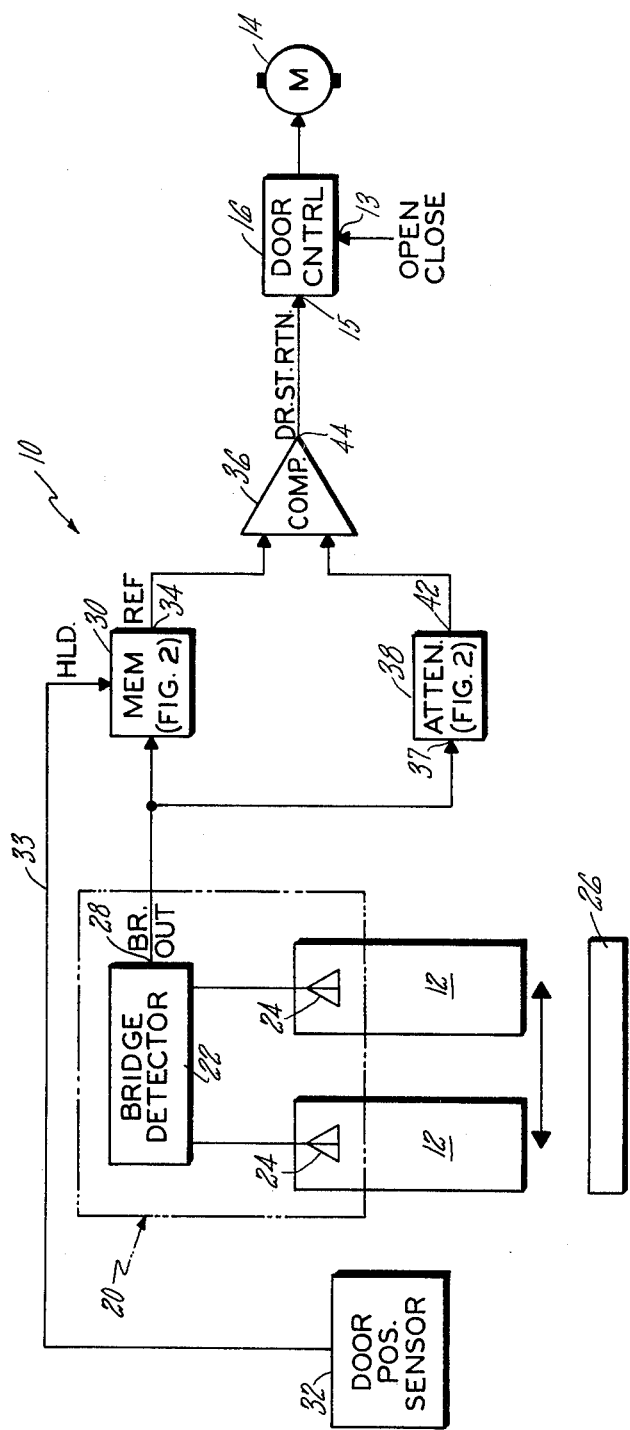
FIG. 1 is a simplified schematic block diagram of an elevator door closing system utilizing an automatic compensating circuit in accordance with the present invention.

FIG. 1 illustrates a door motion control system 10 in which a pair of elevator doors 12 are opened and closed by operating an electric motor 14. Operation of the motor 14 is regulated by a door motion controller 16. On an input 13, the controller receives door open and close (OPEN-CLOSE) signals from the elevator central controller (not shown) and in response regulates the electric motor 14 accordingly. In addition, on an input 15, it receives an override door stop and retraction (DSR) signal from an object detection system, which detects the presence of an object or person between the doors as they are closing. In response to the door stop and retraction signals the controller reverses the doors and holds them in a fully open position until the door stop and retraction signal is no longer transmitted.

The object detection system includes an object detection circuit 20 of the type described in the aforementioned patent. The detection circuit includes a balance bridge detector 22 which is coupled to an antenna 24 in each elevator door 12. The balance bridge detector is responsive to the capacitance between the antenna and the car floor 26, which is a ground potential. The bridge detector 22 produces an output signal (BRDG OUT) on its output 28; the magnitude or level of the signal is indicative of the capacitance between the antenna and ground. Normally the bridge is adjusted so that the bridge output is at or near zero when the doors are completely closed; however, variations in structure and humidity will produce unpredictable variations in it.

The bridge output signal is supplied to a memory unit 30. A door position sensor transmits a hold (HLD) signal over a line 33 to the memory unit when the doors are a predetermined distance apart during opening. In response to the hold signal, the memory unit stores the bridge output signal produced during hold signal generation. As the doors continue to open further, the hold signal is discontinued but the memory unit continues to retain the bridge output signal that has been stored. This stored signal is used to produce a reference (REF) signal on the memory output 34 which connects to one terminal a comparator 36. The reference signal is indicative of the detected or sensed capacitance when the doors are slightly apart, and, specifically, of the effects produced by the environment, the structure and any objects which may be in the doors' path just as they are opening.

The bridge output is continuously applied to the input 37 of adjustable or programmable attenuator circuit 38. The attenuator produces an adjustable output (AT OUT) signal at its output 42, which connects to the other terminal of the comparator 36. The principal purpose for the attenuator is to assure that the signal produced by an object passing between the doors (after they are fully open) will produce a signal on the attenuator output 42 exceeding the reference signal on the memory output 34. Any difference between the two signals represents the presence of an object between the doors. In response to a difference exceeding a predetermined level, the comparator 36 produces the door stop and return signal at its output 44, which connects to the controller 16. In response, the controller stops the door and reverses the motor in order to bring the doors to the fully opened position. As long as an object is in the path of the doors, the attenuator output signal will exceed the reference signal, and thus the door stop and return signal will continue and the controller will continue to hold the doors open.

Figure 2:
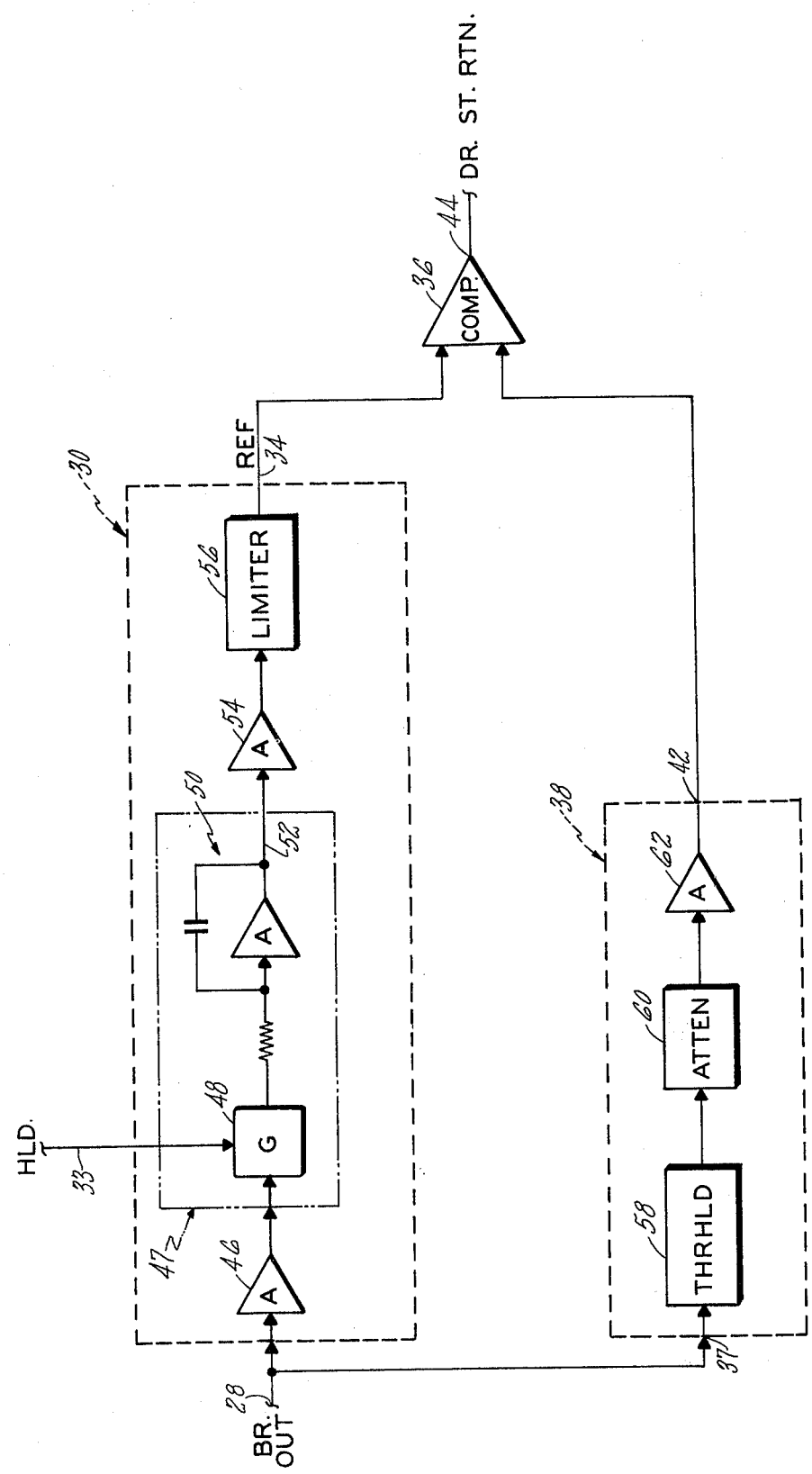
FIG. 2 is a schematic block diagram of an automatic compensating circuit according to the present invention.

Referring to FIG. 2, the memory unit 30 includes a buffer amplifier 46 whose output is connected to a sample and hold circuit 47. The sample and hold circuit may include a gate 48 which transmits the bridge output signal to an integrator 50 in response to the hold signal from the door position sensor 32. The gate may simply be a mechanical switch or a FET in series between the buffer amplifier and the sample and hold circuit. FET gates are commercially available. The integrator time constant (RC) preferably is significantly less than the duration of the hold signal, thus causing the bridge output signal to appear on the integrator output 52 during hold signal generation.

The output from the integrator is supplied to a buffer amplifier 54 whose output is connected to a limiting circuit 56. This limiting circuit, which may consist of a zener diode or similar clamping device, limits the maximum reference signal level on the memory circuit output 34. The purpose for the limiting circuit is to ensure that the reference signal will always be less than the signal produced on the attenuator output 42 by a detected object. The necessity for this arises because it is possible that when the doors are at the predetermined distance apart, and the hold signal is transmitted from the door position sensor, an object may be between the doors; as a result, the bridge output will be considerably higher than it is when an object is not so present. If this bridge output signal is stored and used for reference, a detectable difference between the reference signal and the attenuator output signal may not occur when the doors are fully open; detection therefore will not take place. Thus, by utilizing a threshold device, the possibility is eliminated that the circuit will be "blinded" in this way to the presence of the object.

The attenuator 38 may include a threshold circuit 58 whose output is supplied to a programmable attenuator circuit 60. The programmable attenuator produces an output which is applied through a buffer amplifier 62 to the comparator 36. As mentioned previously, the attenuator 38 provides means for adjusting the level of the signal on the line 42 so that it is roughly the same as the reference signal, when an object is *not* between the doors, and, as a result, the door stop return signal on the comparator output line 44 will be produced only if an object is in fact between the doors.

The threshold circuit 58 is provided to limit the sensitivity of the system so that a change in signal level on the attenuator output 42 occurs if there is a significant change in the bridge output signal level on the attenuator input 40. In this way the detection circuit has increased immunity to noise. The threshold circuit 58 may consist of a diode or similar nonlinear transmission devices, essentially having low, small signal transmission qualities. The attenuator 60 may consist simply of a potentiometer or it may consist of an arrangement of resistors and interconnecting switch contacts which can be opened and closed in predetermined combinations to achieve predetermined attenuation functions between the input 40 and output 42 of the attenuator 38.

The door position sensor, which controls the operation of the gate, may be cam operated switches or relays responsive to the movement of the doors, or it may be a photocell position detector. However, other means for sensing the door position are well known and may be used to generate the hold signal to the gate.

Obviously, detection (during opening) may take place at a number of door positions (rather than one) and the reference signal may be obtained by averaging the bridge output at each of these positions. In a similar fashion, the maximum possible reference signal level obtained during sampling may also be limited. For this reason, the present invention may be utilized with well known and understood digital and computer techniques. Similar applications for such apparatus may also be made to provide the functions of the attenuator 38. Thus, it is obvious that the present invention may be embodied in a computer based system suitably programmed to accomplish the detection, referencing, attenuation and comparison provided by the preferred embodiment, shown in FIG. 1, which is geared to existing detection systems of the type caught in the aforementioned patents.

While the foregoing is a description of the preferred embodiment of the present invention, various modifications, changes and adjustments thereto and therein may be made without departing from the true scope and spirit of the invention, hereinafter claimed.

I claim:

1. An apparatus for detecting objects in doorways of an elevator system in which doors are opened and closed within the doorways, comprising:
   means for generating a detection signal in response to the capacitance variation produced by a detectable object in the path of one of said doors;
   means for storing a reference signal, during door operation, indicative of the capacitance conditions of the doorway, said reference signal being variable as a function of variable capacitance conditions at each of said doorways; and
   means for comparing the levels of said reference signal and the detection signal for each of said doorways as the door closes for generating a door motion control signal.

2. An apparatus according to claim 1, wherein, said reference signal is derived from a detection signal provided by said generating means when one of said doors is at an intermediate position of one of said doorways, during opening.

3. An apparatus according to claim 2, wherein, said reference signal level is limited to a level less than the detection signal level produced by a detectable object.

4. An apparatus according to claim 1, wherein said means for storing, comprises:
   a memory unit,
   a gate and
   a door position sensor,
      said door position sensor controlling the operation of said gate to coupling a detection signal to said memory unit at a preselected intermediate position of one of said doors as it opens,
   said memory unit storing said coupled detection signal.

5. An apparatus according to claim 4, wherein, said means for storing includes means for limiting said reference signal to a level less than the level of the detection signal produced by a detectable object.

6. An apparatus according to claim 4, wherein said memory unit comprises an integrator circuit.

7. An automatically compensating elevator door motion control system for detecting objects in doorways of an elevator system, said control system comprising:
   an electric motor for opening and closing doors of an elevator,
   a motor controller for controlling the electric motor,
   an object detection system which includes antennae in doors of an elevator for detecting an object in proximity to the doors by sensing the change in antenna to ground capacitance the object produces, said system producing a first detection signal in response to a detected object in the path of one of said doors and a second detection signal at an intermediate position along said path of said door, as the door is opened, said second detection signal is indicative of the capacitance condition of the doorway, and also being variable as a function of variable capacitance conditions at each of said doorways,
   means for storing said second detection signal and limiting it to a level different than said first detection signal, and
   means for comparing said first and second detection signals and generating a door motion control signal, in response to a difference therebetween, for controlling operation of said motor controller.

* * * * *